US007671415B2

(12) United States Patent
Kuroda et al.

(10) Patent No.: US 7,671,415 B2
(45) Date of Patent: Mar. 2, 2010

(54) ELECTRO-STATIC DISCHARGE PROTECTION CIRCUIT AND SEMICONDUCTOR DEVICE HAVING THE SAME

(75) Inventors: Toshikazu Kuroda, Tokyo (JP);
Hirokazu Hayashi, Tokyo (JP);
Yasuhiro Fukuda, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 701 days.

(21) Appl. No.: 11/276,823

(22) Filed: Mar. 15, 2006

(65) Prior Publication Data
US 2006/0220137 A1 Oct. 5, 2006

(30) Foreign Application Priority Data
Mar. 30, 2005 (JP) ............................. 2005-098638

(51) Int. Cl.
*H01L 23/62* (2006.01)
(52) U.S. Cl. ............................... 257/355; 257/E29.211
(58) Field of Classification Search ................. 257/355, 257/360, 361, 365, 565, 566, 577, E29.211, 257/E29.224, E29.225
See application file for complete search history.

(56) References Cited

U.S. PATENT DOCUMENTS 4,607,274 A * 8/1986 Yoshitake .................... 257/357

2002/0153571 A1 * 10/2002 Mergens et al. ............. 257/358

OTHER PUBLICATIONS

Bart Keppens et al., "ESD Protection Solutions for High Voltage Technologies" 2004 EOS/ESD Symposium.

* cited by examiner

*Primary Examiner*—Sue Purvis
*Assistant Examiner*—Kevin Quinto
(74) *Attorney, Agent, or Firm*—Volentine & Whitt, P.L.L.C.

(57) ABSTRACT

An electro-static discharge protection circuit and a semiconductor device having the same is disclosed. The electro-static discharge protection circuit has a current control circuit. The current control circuit has a first capacitive element. When the external source voltage is applied to the external source voltage supply line, the booster circuit in the internal circuitry boosts the internal source voltage of the internal source voltage supply line. The external source voltage becomes transiently greater than the internal source voltage at the early stage of the boosting step when the booster circuit boosts the internal source voltage based on the external source voltage. The first capacitive element restricts a current from flowing from the second terminal of the thyristor rectifier circuit to the internal source voltage, even when the external source voltage becomes transiently greater than the internal source voltage at the early stage of the boosting step when the booster circuit boosts the internal source voltage based on the external source voltage. This prevents the thyristor rectifier circuit from malfunctioning and turning on.

16 Claims, 9 Drawing Sheets

US 7,671,415 B2

ELECTRO-STATIC DISCHARGE PROTECTION CIRCUIT AND SEMICONDUCTOR DEVICE HAVING THE SAME

This Nonprovisional application claims priority under 35 U.S.C. §119(a) to Patent Application No. 2005-098638 filed in Japan on Mar. 30, 2005, the entire contents of which are hereby incorporated by reference.

BACKGROUND OF THE INVENTION

1. Field of the Invention

The present invention relates to an electro-static discharge protection circuit to protect internal circuitry from electro-static discharge (ESD).

2. Description of the Related Art

An electro-static discharge protection circuit is established between an external source voltage supply line Vcc and internal circuitry of a semiconductor integrated circuit to protect the internal circuitry against a surge current caused by electro-static discharge (ESD) applied to the external source voltage supply line Vcc. As used herein, the term "internal circuitry" means one or more circuits to be protected against electro-static discharge (ESD) by an electro-static discharge protection circuit.

Electro-static discharge protection circuits using a rectifier with thyristors are known in the art, and one such circuit was disclosed in the 2004 EOS/ESD Symposium, "ESD Protection Solution for High Voltage Technologies", (C. Principle of ESD-on-SCR). The electro-static discharge protection circuit includes a thyristor and a substrate resistance. The thyristor further includes a vertical PNP bipolar transistor and a lateral NPN bipolar transistor. Application of electro-static discharge (ESD) to the external source voltage supply line Vcc causes a current to be injected or charged into a chip capacitance. The current triggers the electro-static discharge protection circuit into an "ON" state of a thyristor mode. This electro-static discharge protection circuit is disclosed as "ESD-on-SCR (ESD-on-Silicon Controlled Rectifier)". As used herein, the term "electro-static discharge protection circuit" means this type of circuit, that is, SCR.

When the external source voltage Vcc, for example 2.5 V, is applied to the external source voltage supply line Vcc, the booster circuit boosts the internal source voltage Vdd of the internal source voltage supply line Vdd up to 23.5 V. At the early stage of the boosting step, the external source voltage Vcc can be transiently greater than the internal source voltage supply line Vdd. At this early stage of the boosting step, a current which flows from the external source voltage supply line Vcc to the internal source voltage supply line Vdd can cause a thyristor included in a protection circuit to malfunction and turn on.

In view of the foregoing, an object of the present invention is to provide an electro-static discharge protection circuit which does not have the problems described above.

Another object of the present invention is to provide a semiconductor device with an electro-static discharge protection circuit which does not have the problems described above.

SUMMARY OF THE INVENTION

The present invention provides an electro-static discharge protection circuit which comprises: a first thyristor rectifier circuit electrically coupled to a first internal circuitry, an external source voltage supply line that supplies an external source voltage to the internal circuitry, and an internal fixed voltage supply line that supplies an internal fixed voltage to the internal circuitry; a first current control circuit electrically coupled to the first thyristor rectifier circuit and an internal source voltage supply line that supplies an internal source voltage to the first internal circuitry, the first current control circuit restricting a current from flowing from the external source voltage supply line to the internal source voltage supply line through the first thyristor rectifier circuit when the external source voltage supply line becomes greater than the internal source voltage supply line, the first current control circuit making a surge current flow to the internal fixed voltage supply line through the first thyristor rectifier circuit by triggering the first thyristor rectifier circuit into a thyristor mode by means of the surge current applied to the external source voltage supply line in order to protect the first internal circuitry from the surge current.

According to the present invention, an electro-static discharge protection circuit to protect a first internal circuitry against a surge current includes a first thyristor rectifier circuit, and a first current control circuit which is electrically connected to the first thyristor rectifier circuit. The first current control circuit restricts a current from flowing from the external source voltage supply line to the internal source voltage supply line through the electro-static discharge protection circuit when the external source voltage becomes transiently greater than the internal source voltage. This prevents the thyristor rectifier circuit from malfunctioning and turning on.

These and other objects, features, aspects, and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

Figure 1:
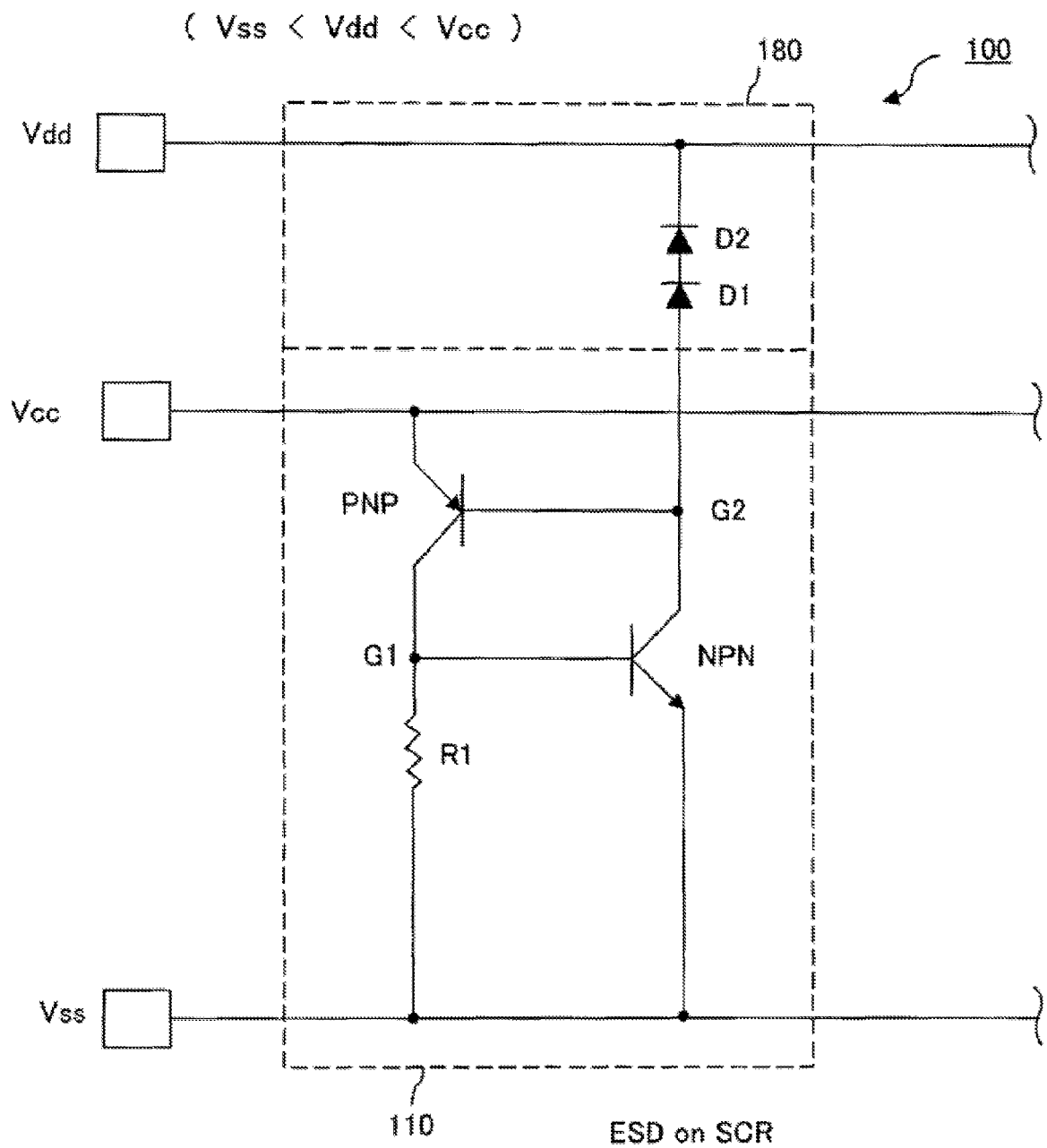
FIG. 1 is an equivalent circuit view of an electro-static discharge protection circuit according to a first embodiment of the present invention.

DETAILED DESCRIPTION OF THE
PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents. Referring now to the drawings, preferred embodiments of the present invention will be described in detail.

(1) First Embodiment

FIG. 1 is an equivalent circuit view of the electro-static discharge protection circuit according to a first embodiment of the present invention. The electro-static discharge protection circuit 100 is electrically connected to an internal source voltage supply line Vdd that supplies an internal source voltage Vdd and an internal fixed voltage supply line Vss that supplies an internal fixed voltage Vss. Also, the electro-static discharge protection circuit 100 is electrically connected to internal circuitry to be protected from a surge current, and an external source voltage supply line Vcc that supplies an external source voltage Vcc.

The electro-static discharge protection circuit 100 has a thyristor rectifier circuit 110, and a current control circuit 180 that is electrically connected to and mechanically coupled with the thyristor rectifier circuit 110. The thyristor rectifier circuit 110 is connected to the current control circuit 180 and the internal fixed voltage supply line Vss. The current control circuit 180 is electrically connected to the thyristor rectifier circuit 110 and the internal source voltage supply line Vdd. The thyristor rectifier circuit 110 and the current control circuit 180 are electrically connected to each other. The thyristor rectifier circuit 110 is further connected to the external source voltage supply line Vcc and the internal circuitry (not shown). The internal circuitry has a booster circuit that boosts the internal source voltage Vdd of the internal source voltage supply line Vdd based on the external source voltage Vcc of the external source voltage supply line Vcc. When the external source voltage Vcc, for example 2.5 V, is applied to the external source voltage supply line Vcc, the booster circuit boosts the internal source voltage Vdd of the internal source voltage supply line Vdd up to 23.5 V. At the early stage of the boosting step, the external source voltage Vcc can be transiently greater than the internal source voltage supply line Vdd. As used herein, the internal fixed voltage Vss supplied by the internal fixed voltage supply line Vss is lower at all times than the internal source voltage Vdd supplied by the internal source voltage supply line Vdd.

The thyristor rectifier circuit 110 has a vertical PNP bipolar transistor PNP1, a lateral NPN bipolar transistor NPN1 and a substrate resistance R1. The vertical PNP bipolar transistor PNP1 has an emitter that is connected to the external source voltage supply line Vcc. The vertical PNP bipolar transistor PNP1 has a collector that is connected to a first terminal G1 and the internal fixed voltage supply line Vss through the substrate resistance R1. The vertical PNP bipolar transistor PNP1 has a base which is connected to the current control circuit 180 through a second terminal G2. The lateral NPN bipolar transistor NPN1 has a collector which is connected to the base of the vertical PNP bipolar transistor PNP1 through the second terminal G2 and with the current control circuit 180 through the second terminal G2. The lateral NPN bipolar transistor NPN1 has an emitter that is connected to the internal fixed voltage supply line Vss. The lateral NPN bipolar transistor NPN1 has a base that is connected to the internal fixed voltage supply line Vss through the first terminal G1 and the substrate resistance R1, and with the collector of the vertical PNP bipolar transistor PNP1 through the first terminal G1.

The electro-static discharge protection circuit 100 is formed in a semiconductor substrate. The collector of the vertical PNP bipolar transistor PNP1 and the base of the lateral NPN bipolar transistor NPN1 are connected to the internal fixed voltage Vss through the substrate resistance R1. This means the semiconductor substrate forms the collector of the vertical PNP bipolar transistor PNP1 and the base of the lateral NPN bipolar transistor.

The current control circuit 180 has a multistage series connection of a plurality of diodes D that is connected to the internal source voltage supply line Vdd and the second terminal G2 of the thyristor rectifier circuit 110. The multistage series connection D has a first electrode that is connected to the internal source voltage supply line Vdd, and a second electrode that is connected to the second terminal G2 of the thyristor rectifier circuit 110. The multistage series connection D supplies a forward breakdown voltage VF that is lower than a surge voltage, and that is transiently greater than the potential difference between the external source voltage Vcc and the internal source voltage Vdd, when the external source voltage Vcc becomes transiently greater than the internal source voltage Vdd at the early stage of the boosting step when the booster circuit boosts the internal source voltage Vdd using the external source voltage Vcc. Accordingly, the multistage series connection D restricts a current from flowing from the second terminal G2 of the thyristor rectifier circuit 110 to the internal source voltage Vdd, even when the external source voltage Vcc becomes transiently greater than the internal source voltage Vdd at the early stage of the boosting step when the booster circuit boosts the internal source voltage Vdd using the external source voltage Vcc. This prevents the thyristor rectifier circuit 110 from malfunctioning and turning on.

Further, when an electro-static discharge (ESD) is applied to the external source voltage supply line Vcc, the multistage series connection of a plurality of diodes D allows the surge current induced by the electro-static discharge (ESD) to flow from the second terminal G2 of the thyristor rectifier circuit 110 to the internal source voltage supply line Vdd.

When the surge current is applied to the external source voltage supply line Vcc, the surge current flows from the emitter to the base of the vertical PNP bipolar transistor PNP1. Further, the current flows from the base of the vertical PNP bipolar transistor PNP1 to the multistage series connection of a plurality of diodes D through the second terminal G2. As described above, the forward break down voltage VF across the multistage series connection of a plurality of diodes D is lower than the surge voltage, and the multistage series connection of a plurality of diodes D allows the surge current to flow from the second terminal G2 of the thyristor rectifier circuit 110 to the internal source voltage supply line Vdd. Accordingly, the potential of the base of vertical PNP bipolar transistor PNP1 rises.

The rise of the potential at the base of the vertical PNP bipolar transistor PNP1 causes the potential difference between the base and the emitter of the vertical PNP bipolar transistor PNP1 to reach a threshold voltage Vbe so that the vertical PNP bipolar transistor PNP1 turns on. This allows the current applied to the external source voltage supply line Vcc to flow from the emitter to the collector of the vertical PNP bipolar transistor PNP1, and further from the collector of the vertical PNP bipolar transistor PNP1 to the internal fixed voltage supply line Vss through the substrate resistance R1. This means that the collector current of the vertical PNP bipolar transistor PNP1 flows into the semiconductor substrate in which the electro-static discharge protection circuit 100 is formed. The collector current flowing into the semiconductor substrate causes the voltage drop across the substrate resistance R1 to be generated, and causes the potential of the semiconductor substrate to rise. Since the potential of the semiconductor substrate corresponds to the potential of the base of the lateral NPN bipolar transistor NPN1, the current flowing into the semiconductor substrate causes the potential of the semiconductor substrate and the potential of the base of the lateral NPN bipolar transistor NPN1 to rise.

On the other hand the emitter potential of the lateral NPN bipolar transistor NPN1 is fixed to the lower voltage supplied by the internal fixed voltage supply line Vss. Thus, as the base potential of the vertical NPN bipolar transistor NPN rises, and the potential difference between the base and the emitter of the lateral NPN bipolar transistor NPN1 reaches a threshold voltage Vbe, the lateral NPN bipolar transistor NPN1 turns on. This turning on allows the current to flow from the collector to the emitter of the lateral NPN bipolar transistor NPN1. Accordingly, by means of the surge current applied to the external source voltage supply line Vcc, the thyristor rectifier circuit 110 is triggered into a thyristor mode.

The forward breakdown voltage VF provided by the multistage series connection of a plurality of diodes D is lower than a surge voltage, and is greater than the difference between the external source voltage Vcc and the internal source voltage Vdd, when the external source voltage Vcc become transiently greater than the internal source voltage Vdd at the early stage of the boosting step when the booster circuit boosts the internal source voltage Vdd using the external source voltage Vcc. Accordingly, the multistage series connection D restricts a current from flowing from the second terminal G2 of the thyristor rectifier circuit 110 to the internal source voltage supply line Vdd, even when the external source voltage Vcc becomes transiently greater than the internal source voltage Vdd at the early stage of the boosting step when the booster circuit boosts the internal source voltage Vdd using the external source voltage Vcc. This prevents the thyristor rectifier circuit 110 from malfunctioning and turning on.

Figure 2:
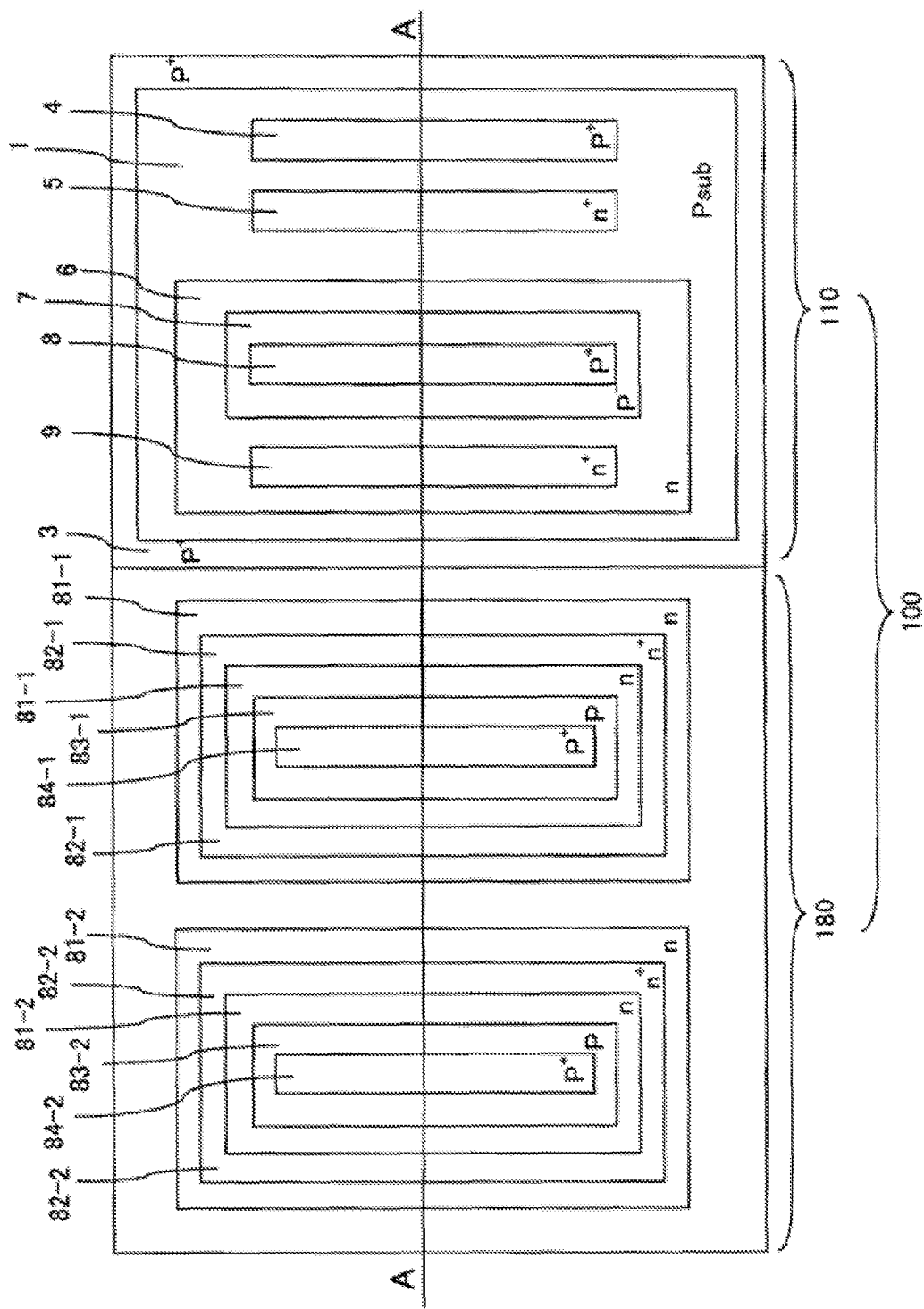
FIG. 2 is a schematic plan view of a schematic layout of the electro-static discharge protection circuit in FIG. 1 according to the first embodiment of the present invention which is formed in a semiconductor substrate.
Figure 3:
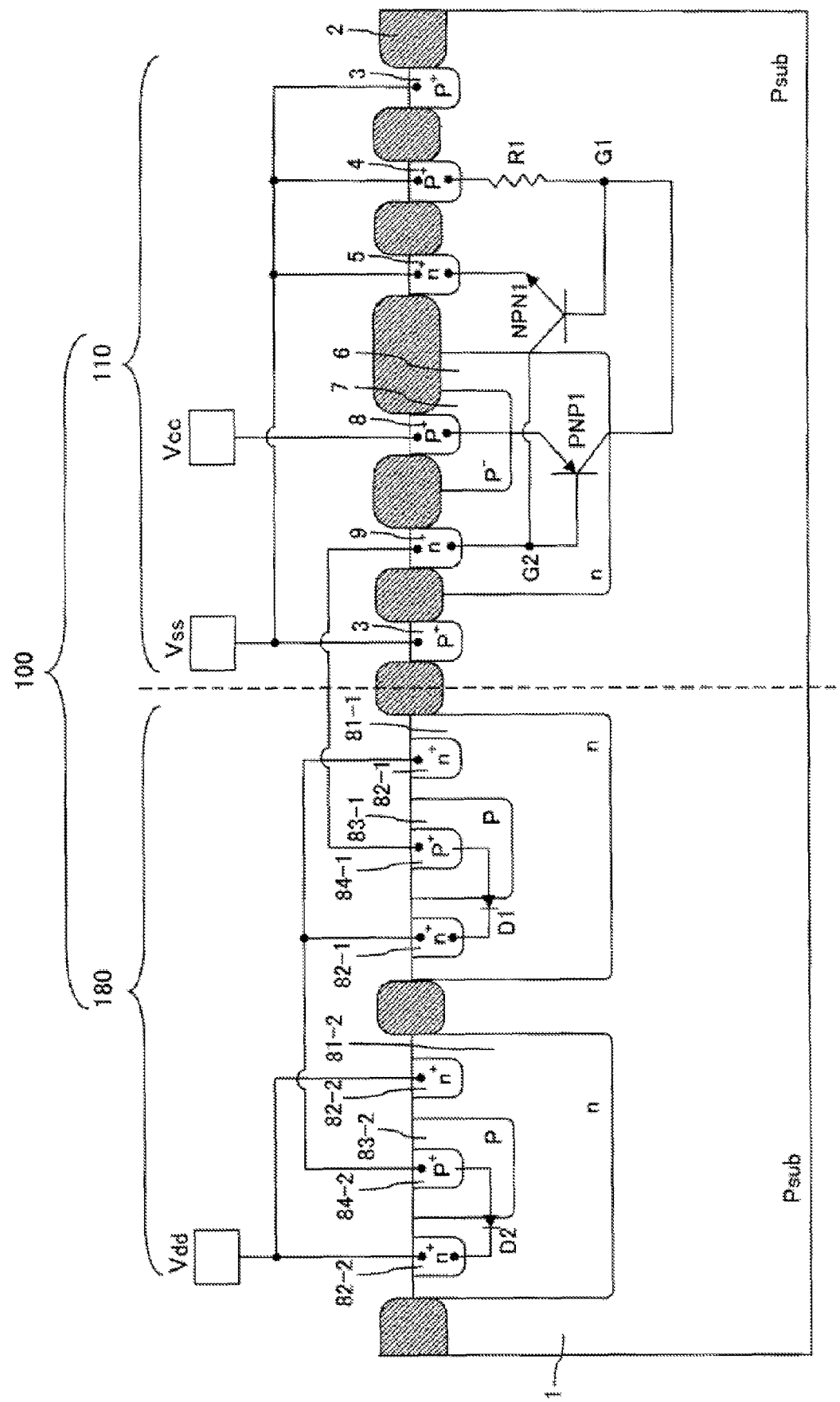
FIG. 3 is a schematic fragmentary longitudinal sectional view of the electro-static discharge protection circuit according to the first embodiment of the present invention taken along A-A line in FIG. 3.

As described above, the electro-static discharge protection circuit 100 is formed in the semiconductor substrate. The layout of the electro-static discharge protection circuit 100 will now be explained bellow. FIG. 2 shows a schematic plan view of a schematic layout of the electro-static discharge protection circuit 100 formed in the semiconductor substrate 1 as explained with the equivalent circuit view in FIG. 1. FIG. 3 shows a schematic fragmentary longitudinal sectional view of the electro-static discharge protection circuit 100 taken along A-A line in FIG. 2.

The electro-static discharge protection circuit 100 has the thyristor rectifier circuit 110 and the current control circuit 180 as described with reference to FIG. 2. The current control circuit 180 is established between the internal source voltage supply line Vdd and the thyristor rectifier circuit 110. The electro-static discharge protection circuit 100, and the internal circuitry to be protected against the surge current by the electro-static discharge protection circuit 100, are formed in the P-type single-crystal semiconductor substrate 1. The electro-static discharge protection circuit 100 is established between the external source voltage supply line Vcc and the internal source voltage supply line Vdd. The electro-static discharge protection circuit 100 has the thyristor rectifier circuit 110 and the current control circuit 180 as described above. The current control circuit 180 is established between the internal source voltage supply line Vdd and the thyristor rectifier circuit 110. The thyristor rectifier circuit 110 is established between the external source voltage supply line Vcc and the internal circuitry.

As described in FIG. 2 and FIG. 3, the P-type single-crystal semiconductor substrate 1 has a surface which is provided with field oxide films 2 to define element separating regions. The field oxide films 2 define active regions in the P-type single-crystal semiconductor substrate 1. The thyristor rectifier circuit 110 is formed in active regions within a region surrounded by a $P^+$ guard ring 3 in the P-type single-crystal semiconductor substrate 1. The current control circuit 180 is formed in active regions within a region surrounded by a $N^+$ guard rings 82-1, 82-2.

The region to establish the thyristor rectifier circuit 110 in the P-type single-crystal semiconductor substrate 1 contains a $P^-$ impurity diffusion region 4, a $N^+$ impurity diffusion region 5 separated by a field oxide film 2 from the $P^+$ impurity diffusion region 4, and an N-well region 6 separated by a field oxide film 2 from the $N^+$ impurity diffusion region 5. The N-well region 6 further contains an $N^+$ impurity diffusion region 9, and a P-type impurity diffusion region 7 separated from the $N^+$ impurity diffusion region 9. The P-type impurity diffusion region 7 further contains a $P^+$ impurity diffusion region 8.

The P-type impurity diffusion region 7 corresponds to the emitter of the vertical PNP bipolar transistor PNP1, the emitter being connected to the external source voltage supply line Vcc through the $P^+$ impurity diffusion region 8. The N-well region 6 corresponds to the base of the vertical PNP bipolar transistor PNP1, the base being connected to the multistage series connection of a plurality of diodes D through the $N^+$ impurity diffusion region 9. The P-type single-crystal semiconductor substrate 1 corresponds to the collector of the vertical PNP bipolar transistor PNP1, the collector being connected to the internal fixed voltage supply line Vss through the $P^+$ impurity diffusion region 4. The P-type single-crystal semiconductor substrate 1 also corresponds to the base of the lateral NPN bipolar transistor NPN1, the base being connected to the internal fixed voltage supply line Vss through the $P^-$ impurity diffusion region 4. The N-well region 6 corresponds to the collector of the lateral NPN bipolar transistor NPN1, the collector being connected to the multistage series connection of a plurality of diodes D through the $N^+$ impurity diffusion region 9. The $N^+$ impurity diffusion region 5 corresponds to the emitter of the lateral NPN bipolar transistor NPN1, the emitter being connected to the internal fixed voltage supply line Vss. Resistance to the current flow in the P-type single-crystal semiconductor substrate 1 corresponds to the substrate resistance R1.

The region in the P-type single-crystal semiconductor substrate 1 to establish the current control circuit 180 is provided with an N-well region 81-1 and a N-well region 81-2 that are separated by a field oxide film 2 from each other. The N-well region 81-1 contains a P-type impurity diffusion region 83-1. The $N^-$well region 81-2 contains a P-type impurity diffusion region 83-2. The P-type impurity diffusion region 83-1 contains a P⁺ impurity diffusion region 84-1. The P-type impurity diffusion region 83-2 has a P⁺ impurity diffusion region 84-2. The N-well region 81-1 further contains a N⁺ impurity diffusion region 82-1 which is separated from the P-type impurity diffusion region 83-1 and surrounds the P-type impurity diffusion region 83-1. The N-well region 81-2 further contains $N^{3O}$ impurity diffusion region 82-2 which is separated from the P-type impurity diffusion region 83-2 and surrounds the P-type impurity diffusion region 83-2. A PN junction which is formed of a P-type impurity diffusion region 83-1 and a N-well region 81-1 corresponds to a first PN junction diode D1. A PN junction which is formed of a P-type impurity diffusion region 83-2 and a N-well region 81-2 corresponds to a second PN junction diode D2. The N-well region 6 which forms the collector of the lateral NPN bipolar transistor NPN1, is connected to the P-type impurity diffusion region 83-1 of the first PN junction diode D1 through the N⁻ impurity diffusion region 9 and the P⁺ impurity diffusion region 84-1. The N-well region 81-1 of the first PN junction diode D1 is connected to the P-type impurity diffusion region 83-2 of the second PN junction diode D2 through the N⁺ impurity diffusion region 82-1 and the P⁺ impurity diffusion region 84-2 . The N-well region 81-2 of the second PN junction diode D2 is connected to the internal source voltage supply line Vdd through the N⁺ impurity diffusion region 82-2.

When a surge current is applied to the external source voltage supply line Vcc, a forward current flows from the P-type impurity diffusion region 7 which forms the emitter of the vertical PNP bipolar transistor PNP1 to the N-well region 6 which forms the base of the vertical PNP bipolar transistor PNP1 through the PN junction. The current further flows from the N-well region 6 which forms the base of the vertical PNP bipolar transistor PNP1 to the P-type impurity diffusion region 83-1 of the first PN junction diode D1, through the N⁺ impurity diffusion region 9 which forms the second terminal G2. The current further flows from the P-type impurity diffusion region 83-1 of the first PN junction diode D1 to the N-well region 81-1 of the first PN junction diode D1 through the PN junction. The current further flows from the N-well region 81-1 of the first PN junction diode D1 to the P-type impurity diffusion region 83-2 of the second PN junction diode D2, through the N⁺ impurity diffusion region 82-1 and the P⁺ impurity diffusion region 84-2. The current further flows from the P-type impurity diffusion region 83-2 of the second PN junction diode D2 to the N-well region 81-2 of the second PN junction diode D2, through the PN junction. The current further flows from the N-well region 81-2 of the second PN junction diode D2 to the internal source voltage supply line Vdd, through the N⁺ impurity diffusion region 82-2. As a result, the potential of the N-well region 6 which forms the base of vertical PNP bipolar transistor PNP1 rises.

As the potential of the N-well region 6 which forms the base rises, and the potential difference between the emitter and the base of the vertical PNP bipolar transistor PNP1, namely, the difference between the potential of the N-well region 6 and the potential of the P⁻ impurity diffusion region 7, reaches a threshold voltage Vbe, the vertical PNP bipolar transistor PNP1 turns on. This turning on causes the surge current applied to the external source voltage supply line Vcc to flow, from the P-type impurity diffusion region 7 which forms the emitter of the vertical PNP bipolar transistor PNP1, to the P-type single-crystal semiconductor substrate 1 which forms the collector of the vertical PNP bipolar transistor PNP1, through the N-well region 6, further to the internal fixed voltage supply line Vss through the substrate resistance R1 and the P⁺ impurity diffusion region 4. In other words, the collector current of the vertical PNP bipolar transistor PNP1 flows into the P-type single-crystal semiconductor substrate 1 in which the electro-static discharge protection circuit 100 is formed. This flow causes the voltage across the resistance R1 to generate, and the potential of the P-type single-crystal semiconductor substrate 1 to rise. Since the potential of the semiconductor substrate corresponds to the potential of the base of the lateral NPN bipolar transistor NPN1, the current flow to the P-type single-crystal semiconductor substrate 1 causes the potential of the P-type single-crystal semiconductor substrate 1 and the potential of the base of the lateral NPN bipolar transistor NPN1 to rise.

Meanwhile, the N⁺ impurity diffusion region 5 which forms the emitter of the lateral NPN bipolar transistor NPN1 is fixed at the lower potential supplied by the internal fixed voltage supply line Vss. Thus as the P-type single-crystal semiconductor substrate 1 which forms the base of the lateral NPN bipolar transistor NPN1 rises, and the potential difference between the base and the emitter of the lateral NPN bipolar transistor NPN1, namely the difference between the potential of the P-type single-crystal semiconductor substrate 1 and the potential of the N⁺ impurity diffusion region 5, reaches a threshold voltage Vbe, the lateral NPN bipolar transistor NPN1 turns on. This turning on causes the current to flow from the N-well region 6 which forms the collector of the lateral NPN bipolar transistor NPN1, to the N⁺ impurity diffusion region 5 which forms the emitter of the lateral NPN bipolar transistor NPN1, through the P-type single-crystal semiconductor substrate 1 which forms the base of the lateral NPN bipolar transistor NPN1. As a result, by means of the surge current, the thyristor rectifier circuit 110 is triggered into a thyristor mode.

The forward breakdown voltage VF supplied by the multistage series connection of a plurality of diodes D is lower than the surge voltage and is greater than the difference between the external source voltage Vcc and the internal source voltage Vdd when the external source voltage Vcc becomes transiently greater than the internal source voltage Vdd at the early stage of the boosting step when the booster circuit boosts the internal source voltage Vdd using the external source voltage Vcc. Accordingly, the multistage series connection of a plurality of diodes D restricts a current from flowing from the second terminal G2 of the thyristor rectifier circuit 110 to the internal source voltage supply line Vdd, even when the external source voltage Vcc becomes transiently greater than the internal source voltage Vdd at the early stage of the boosting step when the booster circuit boosts the internal source voltage Vdd using the external source voltage Vcc. This prevents the thyristor rectifier circuit 110 from malfunctioning and turning on.

The electro-static discharge protection circuit 100 as described above has the current control circuit 180. The current control circuit 180 has the multistage series connection of a plurality of diodes D. When the external source voltage Vcc, for example 2.5 V, is applied to the external source voltage supply line Vcc, the booster circuit of the internal circuitry boosts the internal source voltage Vdd of the internal source voltage supply line Vdd up to 23.5 V. At the early stage of the boosting step when the booster circuit boosts the internal source voltage Vdd using the external source voltage Vcc, the external source voltage Vcc becomes transiently greater than the internal source voltage supply line Vdd. Meanwhile, the forward breakdown voltage VF supplied by the multistage series connection of a plurality of diodes D is lower than the surge voltage, and is greater than the difference between the external source voltage Vcc and the internal source voltage Vdd, when the external source voltage Vcc becomes transiently greater than the internal source voltage Vdd at the early stage of the boosting step when the booster circuit boosts the internal source voltage Vdd using the external source voltage Vcc. Accordingly, the multistage series connection of a plurality of diodes D restricts a current from flowing from the second terminal G2 of the thyristor rectifier circuit 110 to the internal source voltage Vdd, even when the external source voltage Vcc becomes transiently greater than the internal source voltage Vdd at the early stage of the boosting step when the booster circuit boosts the internal source voltage Vdd using the external source voltage Vcc. This prevents the thyristor rectifier circuit 110 from malfunctioning and turning on.

On the other hand when an electro-static discharge (ESD) is applied to the external source voltage supply line Vcc, the multistage series connection of a plurality of diodes D allows the surge current induced by the electro-static discharge (ESD) to flow from the second terminal G2 of the thyristor rectifier circuit 110 to the internal source voltage supply line Vdd. This enables the internal circuitry to be protected from the surge current.

(2) Second Embodiment

Figure 4:
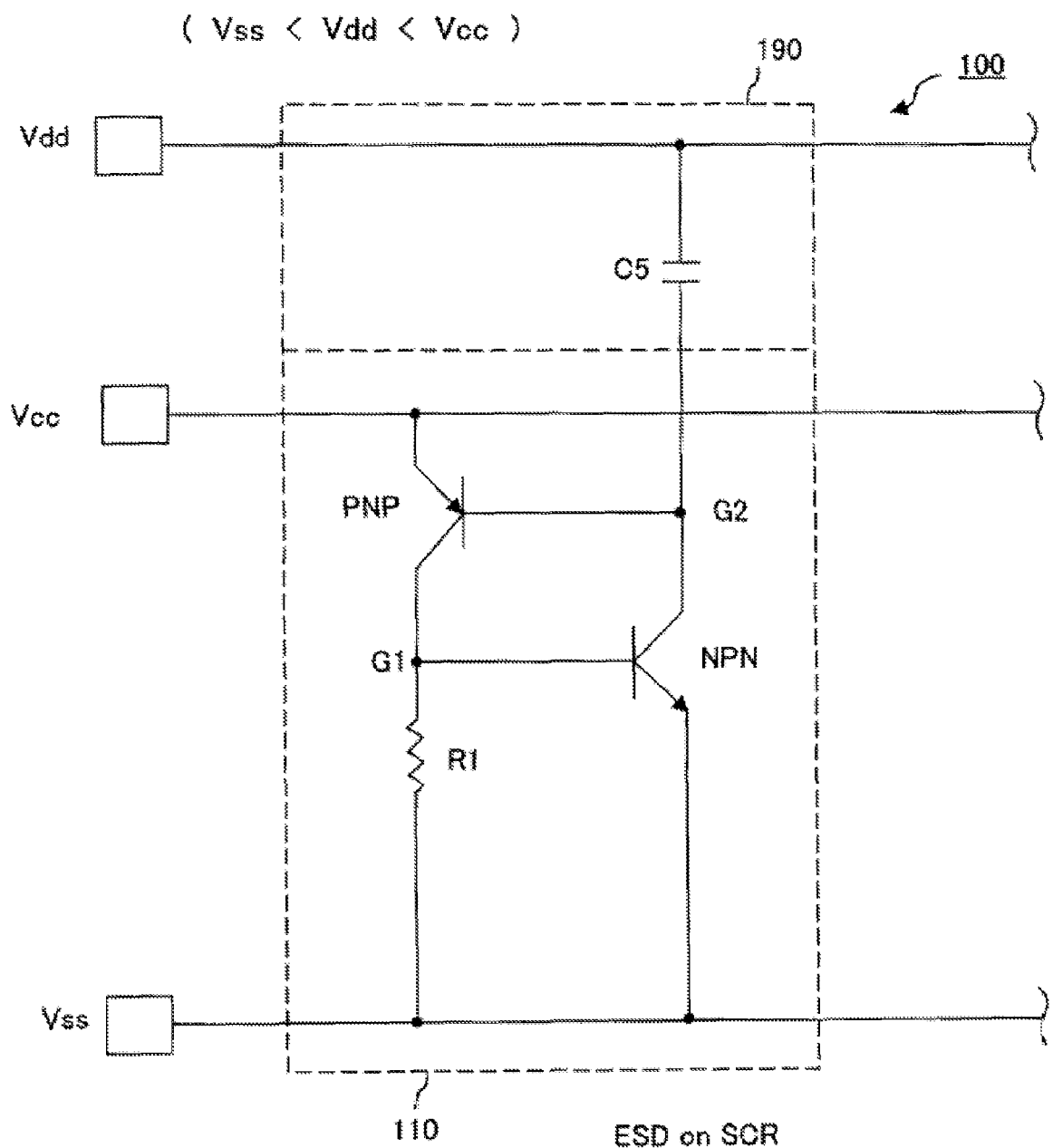
FIG. 4 is an equivalent circuit view of an electro-static discharge protection circuit according to a first embodiment of the present invention.

FIG. 4 shows an equivalent circuit view of the electro-static discharge protection circuit according to a second embodiment of the present invention. The electro-static discharge protection circuit 100 is electrically connected to an internal source voltage supply line Vdd that supplies an internal source voltage Vdd and an internal fixed voltage supply line Vss that supplies an internal fixed voltage Vss. Also, the electro-static discharge protection circuit 100 is electrically connected to internal circuitry to be protected from a surge current, and an external source voltage supply line Vcc that supplies an external source voltage Vcc.

The electro-static discharge protection circuit 100 has a thyristor rectifier circuit 110, and a current control circuit 190 that is electrically connected and mechanically coupled with the thyristor rectifier circuit 110. The thyristor rectifier circuit 110 is connected to the current control circuit 190 and the internal fixed voltage supply line Vss. The current control circuit 190 is electrically connected to the thyristor rectifier circuit 110 and the internal source voltage supply line Vdd. The thyristor rectifier circuit 110 and the current control circuit 190 are electrically connected to each other. The thyristor rectifier circuit 110 is further connected to the external source voltage supply line Vcc and internal circuitry (not shown). The internal circuitry has a booster circuit that boosts the internal source voltage Vdd of the internal source voltage supply line Vdd based on the external source voltage Vcc of the external source voltage supply line Vcc. When the external source voltage Vcc, for example 2.5 V, is applied to the external source voltage supply line Vcc, the booster circuit boosts the internal source voltage Vdd of the internal source voltage supply line Vdd up to 23.5 V. At the early stage of the boosting, the external source voltage Vcc can be transiently greater than the internal source voltage supply line Vdd. As used herein, the internal fixed voltage Vss supplied by the internal fixed voltage supply line Vss is lower at all times than the internal source voltage Vdd supplied by the internal source voltage supply line Vdd.

The thyristor rectifier circuit 110 has a vertical PNP bipolar transistor PNP1, a lateral NPN bipolar transistor NPN1, and a substrate resistance R1. The vertical PNP bipolar transistor PNP1 has an emitter that is connected to the external source voltage supply line Vcc. The vertical PNP bipolar transistor PNP1 has a collector that is connected to a first terminal G1 and the internal fixed voltage supply line Vss through the first terminal G1 and the substrate resistance R1. The vertical PNP bipolar transistor PNP1 has a base that is connected to the current control circuit 190 through a second terminal G2. The lateral NPN bipolar transistor NPN1 has a collector that is connected to the base of the vertical PNP bipolar transistor PNP1 through the second terminal G2 and with the current control circuit 190 through the second terminal G2. The lateral NPN bipolar transistor NPN1 has an emitter that is connected to the internal fixed voltage supply line Vss. The lateral NPN bipolar transistor NPN1 has a base that is connected to the internal fixed voltage supply line Vss through the first terminal G1 and the substrate resistance R1, and with the collector of the vertical PNP bipolar transistor PNP1 through the first terminal G1.

The electro-static discharge protection circuit 100 is formed in a semiconductor substrate. The collector of the vertical PNP bipolar transistor PNP1 and the base of the lateral NPN bipolar transistor NPN1 are connected to the internal fixed voltage Vss through the substrate resistance R1. This means the semiconductor substrate forms the collector of the vertical PNP bipolar transistor PNP1 and the base of the lateral NPN bipolar transistor.

The current control circuit 190 has a first capacitive element C5 which is connected to the internal source voltage supply line Vdd and the second terminal G2 of the thyristor rectifier circuit 110. The first capacitive element C5 has a first electrode which is connected to the internal source voltage supply line Vdd, and a second electrode which is connected to the second terminal G2 of the thyristor rectifier circuit 110. The first capacitive element C5 restricts a current from flowing from the second terminal G2 of the thyristor rectifier circuit 110 to the internal source voltage Vdd, when the external source voltage Vcc becomes transiently greater than the internal source voltage Vdd at the early stage of the boosting step when the booster circuit boosts the internal source voltage Vdd using the external source voltage Vcc. This prevents the thyristor rectifier circuit 110 from malfunctioning and turning on.

Further, when an electro-static discharge (ESD) inputs into the external source voltage supply line Vcc, the first capacitive element C5 allows a surge current induced by electro-static discharge (ESD) applied to the external source voltage supply line Vcc to flow, from the second terminal G2 of the thyristor rectifier circuit 110 to the internal source voltage supply line Vdd to charge the first capacitive element C5.

When the surge current is applied to the external source voltage supply line Vcc, the surge current flows from the emitter to the base of the vertical PNP bipolar transistor PNP1. Further, the current flows from the base of the vertical PNP bipolar transistor PNP1 to the first capacitive element C5 through the second terminal G2 to charge the first capacitive element C5. Accordingly, the voltage of the base of vertical PNP bipolar transistor PNP1 rises.

The rise in potential at the base of the vertical PNP bipolar transistor PNP1 causes the potential difference between the base and the emitter of the vertical PNP bipolar transistor PNP1 to reach a threshold voltage Vbe so that the vertical PNP bipolar transistor PNP1 turns on. This allows the current applied to the external source voltage supply line Vcc to flow from the emitter to the collector of the vertical PNP bipolar transistor PNP1, and further from the collector to the internal fixed voltage supply line Vss through the substrate resistance R1. This means that the collector current of the vertical PNP bipolar transistor PNP1 flows into the semiconductor substrate in which the electro-static discharge protection circuit 100 is formed. The collector current flow to the semiconductor substrate causes the voltage drop across the substrate resistance R1 to be generated, and causes the potential of the semiconductor substrate to rise. Since the potential of the semiconductor substrate corresponds to the potential of the base of the lateral NPN bipolar transistor NPN1, the current flowing into the semiconductor substrate causes the potential of the semiconductor substrate and the potential of the base of the lateral NPN bipolar transistor NPN1 to rise.

On the other hand, the emitter potential of the lateral NPN bipolar transistor NPN1 is fixed to the lower voltage supplied by the internal fixed voltage supply line Vss. Thus, as the base potential of the vertical NPN bipolar transistor NPN rises, and the potential difference between the base and the emitter of the lateral NPN bipolar transistor NPN1 reaches a threshold voltage Vbe, the lateral NPN bipolar transistor NPN1 turns on. This turning on allows the current to flow from the collector to the emitter of the lateral NPN bipolar transistor NPN1. Accordingly, by means of the surge current applied to the external source voltage supply line Vcc, the thyristor rectifier circuit 110 is triggered into a thyristor mode.

Further, the current flow from the second terminal G2 of the thyristor rectifier circuit 110 to the internal source voltage Vdd is restricted even when the external source voltage Vcc becomes transiently greater than the internal source voltage Vdd at the early stage of the boosting step, when the booster circuit boosts the internal source voltage Vdd using the external source voltage Vcc. Accordingly, the first capacitive element C5 restricts a current from flowing from the second terminal G2 of the thyristor rectifier circuit 110 to the internal source voltage Vdd, even when the external source voltage Vcc becomes transiently greater than the internal source voltage Vdd at the early stage of the boosting step when the booster circuit boosts the internal source voltage Vdd using the external source voltage Vcc. This prevents the thyristor rectifier circuit 110 from malfunctioning and turning on.

Figure 5:
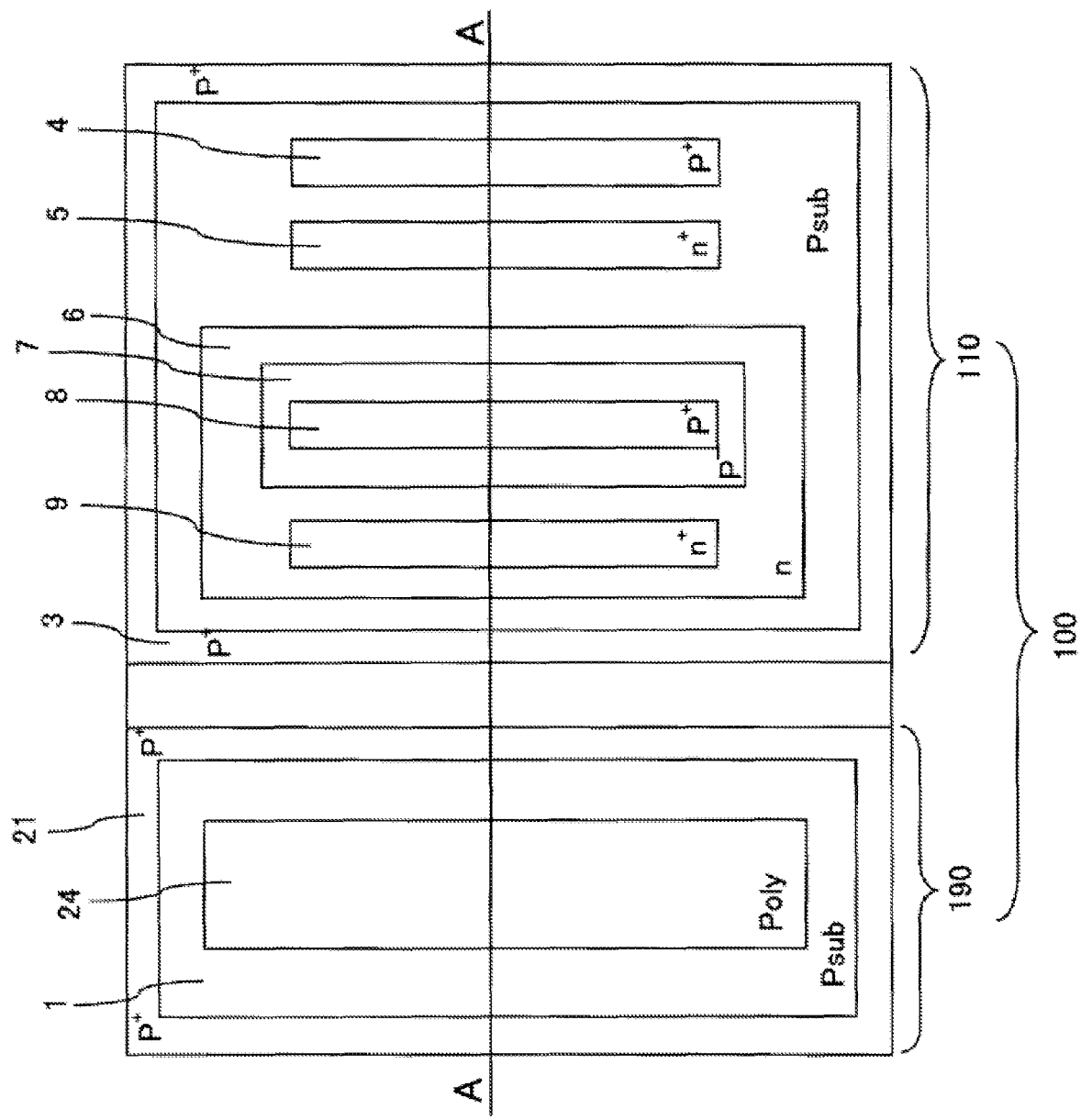
FIG. 5 is a schematic plan view of a schematic layout of the electro-static discharge protection circuit in FIG. 4 according to the first embodiment of the present invention which is formed in a semiconductor substrate.
Figure 6:
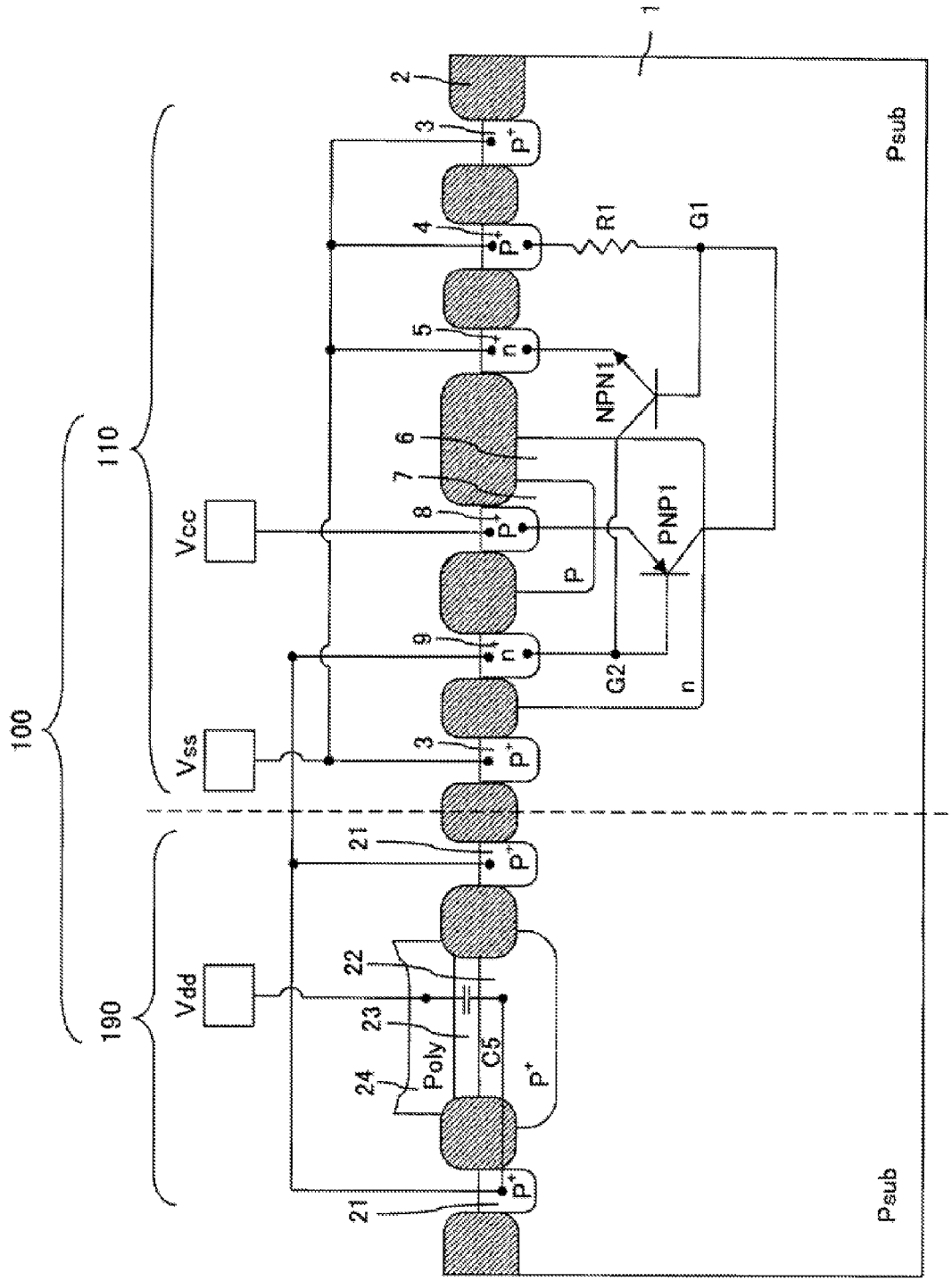
FIG. 6 is a schematic fragmentary longitudinal sectional view of the electro-static discharge protection circuit according to the first embodiment of the present invention taken along A-A line in FIG. 5.

As described above, the electro-static discharge protection circuit 100 is formed in the semiconductor substrate. The layout of the electro-static discharge protection circuit 100 will now be explained below. FIG. 5 shows a schematic plan view of a schematic layout of the electro-static discharge protection circuit 100 formed in the semiconductor substrate 1 which is explained with the equivalent circuit view in FIG. 4. FIG. 6 shows a schematic fragmentary longitudinal sectional view of the electro-static discharge protection circuit 100 taken along A-A line in FIG. 5.

The electro-static discharge protection circuit 100 has the thyristor rectifier circuit 110 and the current control circuit 190 as described with reference to FIG. 5. The current control circuit 190 is established between the internal source voltage supply line Vdd and the thyristor rectifier circuit 110. The electro-static discharge protection circuit 100, and the internal circuitry to be protected against the surge current by the electro-static discharge protection circuit 100, are formed in the P-type single-crystal semiconductor substrate 1. The electro-static discharge protection circuit 100 is established between the external source voltage supply line Vcc and the internal source voltage supply line Vdd. The electro-static discharge protection circuit 100 has the thyristor rectifier circuit 110 and the current control circuit 190 as described above. The current control circuit 190 is established between the internal source voltage supply line Vdd and the thyristor rectifier circuit 110. The thyristor rectifier circuit 110 is established between the external source voltage supply line Vcc and the internal circuitry.

As described in FIG. 5 and FIG. 6, the P-type single-crystal semiconductor substrate 1 has a surface which is provided with field oxide films 2 to define element separating regions. The field oxide films 2 define active regions in the P-type single-crystal semiconductor substrate 1. The thyristor rectifier circuit 110 is formed in active regions within a region surrounded by a $P^+$ guard ring 3 in the P-type single-crystal semiconductor substrate 1. The current control circuit 190 is formed in active regions within a region surrounded by a $P^+$ guard ring 21.

The region to establish the thyristor rectifier circuit 110 in the P-type single-crystal semiconductor substrate 1 contains a $P^-$ impurity diffusion region 4, a $N^+$ impurity diffusion region 5 separated by a field oxide film 2 from the $P^+$ impurity diffusion region 4, and an N-well region 6 separated by a field oxide film 2 from the $N^+$ impurity diffusion region 5. The N-well region 6 further contains an $N^+$ impurity diffusion region 9, and a P-type impurity diffusion region 7 separated from the $N^+$ impurity diffusion region 9. The P-type impurity diffusion region 7 further contains a $P^+$ impurity diffusion region 8.

The P-type impurity diffusion region 7 corresponds to the emitter of the vertical PNP bipolar transistor PNP1, the emitter being connected to the external source voltage supply line Vcc through the $P^{30}$ impurity diffusion region 8. The N-well region 6 corresponds to the base of the vertical PNP bipolar transistor PNP1, the base being connected to the multistage series connection of a plurality of diodes D through the $N^+$ impurity diffusion region 9. The P-type single-crystal semiconductor substrate 1 corresponds to the collector of the vertical PNP bipolar transistor PNP1, the collector being connected to the internal fixed voltage supply line Vss through the $P^+$ impurity diffusion region 4. The P-type single-crystal semiconductor substrate 1 also corresponds to the base of the lateral NPN bipolar transistor NPN1, the base being connected to the internal fixed voltage supply line Vss through the $P^+$ impurity diffusion region 4. The N-well region 6 corresponds to the collector of the lateral NPN bipolar transistor NPN1, the collector being connected to the multistage series connection of a plurality of diodes D through the $N^+$ impurity diffusion region 9. The $N^+$ impurity diffusion region 5 corresponds to the emitter of the lateral NPN bipolar transistor NPN1, the emitter being connected to the internal fixed voltage supply line Vss. Resistance to the current flow in the P-type single-crystal semiconductor substrate 1 corresponds to the substrate resistance R1.

The region in the P-type single-crystal semiconductor substrate 1 to establish the current control circuit 190 is provided with a $P^+$ impurity diffusion region 22 separated from the $P^+$ guard ring 21 through the field oxide film 2, a first dielectric film 23 lying on the $P^+$ impurity diffusion region 22, and a first poly silicon film 24 lying on the first dielectric film 23. The $P^+$ impurity diffusion region 22, the first dielectric film 23 and first poly silicon film 24 forms the first capacitive element C5. In other words, the first capacitive element C5 consists of a MOS capacitor. The first poly silicon film 24 corresponds to the first electrode of the first capacitive element C5. The first electrode is connected to the internal source voltage Vdd. The $P^+$ impurity diffusion region 22 corresponds to the second electrode of the first capacitive element C5. The second electrode is connected to the N-well region 6 through the P-type single-crystal semiconductor substrate 1, the $P^+$ impurity diffusion region 21 and the $N^+$ impurity diffusion region 9. The N-well region 6 corresponds to the collector of the vertical PNP bipolar transistor PNP1 and the base of the lateral NPN bipolar transistor NPN1.

When a surge current is applied to the external source voltage supply line Vcc, a forward current flows from the P-type impurity diffusion region 7 which forms the emitter of the vertical PNP bipolar transistor PNP1 to the N-well region 6 which forms the base of the vertical PNP bipolar transistor PNP1 through the PN junction. Further, the current flows from the N-well region 6 which forms the base of the vertical PNP bipolar transistor PNP1, to the P⁺ impurity diffusion region 22 which forms the second electrode of the first capacitive element C5, through the N⁺ impurity diffusion region 9 which forms the second terminal G2, the P⁺ guard ring 21 and the P-type single-crystal semiconductor substrate 1, to charge the first capacitive element C5. This allows the first capacitive element C5 to provide a constant and sufficient capacitance. The first capacitive element C5, other than the stray capacitances, consistently ensures the flow of a surge current applied to the external source voltage supply line Vcc to flow to the first capacitive element C5, through the emitter and the base of the vertical PNP bipolar transistor PNP1. As a result, the potential of the N-well region 6 which forms the base of vertical PNP bipolar transistor PNP1 rises.

As the potential of the N-well region 6 which forms the base of vertical PNP bipolar transistor PNP1 rises, and the potential difference between the emitter and the base of the vertical PNP bipolar transistor PNP1, namely, the difference between the potential of the N-well region 6 and the potential of the P⁻ impurity diffusion region 7, reaches a threshold voltage Vbe, the vertical PNP bipolar transistor PNP1 turns on. This turning on causes the surge current applied to the external source voltage supply line Vcc to flow, from the P-type impurity diffusion region 7 which forms the emitter of the vertical PNP bipolar transistor PNP1, to the P-type single-crystal semiconductor substrate 1 which forms the collector of the vertical PNP bipolar transistor PNP1, through the N-well region 6, further to the internal fixed voltage supply line Vss through the substrate resistance R1 and the P⁺ impurity diffusion region 4. In other words, the collector current of the vertical PNP bipolar transistor PNP1 flows into the P-type single-crystal semiconductor substrate 1 in which the electro-static discharge protection circuit 100 is formed. This flow causes the voltage across the resistance R1 to generate, and the potential of the P-type single-crystal semiconductor substrate 1 to rise. Since the potential of the semiconductor substrate corresponds to the potential of the base of the lateral NPN bipolar transistor NPN1, the current flow to the P-type single-crystal semiconductor substrate 1 causes the potential of the P-type single-crystal semiconductor substrate 1 and the potential of the base of the lateral NPN bipolar transistor NPN1 to rise.

Meanwhile, the N⁺ impurity diffusion region 5 which forms the emitter of the lateral NPN bipolar transistor NPN1 is fixed at the lower potential supplied by the internal fixed voltage supply line Vss. Thus as the P-type single-crystal semiconductor substrate 1 which forms the base of the lateral NPN bipolar transistor NPN1 rises, and the potential difference between the base and the emitter of the lateral NPN bipolar transistor NPN1, namely the difference between the potential of the P-type single-crystal semiconductor substrate 1 and the potential of the N⁺ impurity diffusion region 5, reaches a threshold voltage Vbe, the lateral NPN bipolar transistor NPN1 turns on. This turning on causes the current to flow from the N-well region 6 which forms the collector of the lateral NPN bipolar transistor NPN1, to the N⁺ impurity diffusion region 5 which forms the emitter of the lateral NPN bipolar transistor NPN1, through the P-type single-crystal semiconductor substrate 1 which forms the base of the lateral NPN bipolar transistor NPN1. As a result, by means of the surge current, the thyristor rectifier circuit 110 is triggered into a thyristor mode.

As described above, the current control circuit 190 including the first capacitive element C5 which is connected to the internal source voltage supply line Vdd and the second terminal G2 of the thyristor rectifier circuit 110, prevents a current from flowing from the N-well region 6 to first poly silicon film 24, even when a current is input into the P⁺ impurity diffusion region 22 corresponding to the second electrode of the first capacitive element C5 from the N-well region 6 corresponding to the base of the vertical PNP bipolar transistor PNP1 in the thyristor rectifier circuit 110, through the N⁺ impurity diffusion region 9, P⁺ guard ring 21, and P-type single-crystal semiconductor substrate 1, when the external source voltage Vcc becomes transiently greater than the internal source voltage supply line Vdd at the early stage of the boosting step when the booster circuit boosts the internal source voltage Vdd using the external source voltage Vcc. Accordingly, the current control circuit 190 including the first capacitive element C5 which is connected to the internal source voltage supply line Vdd and the second terminal G2 of the thyristor rectifier circuit 110, restricts a current from flowing from the second terminal G2 of the thyristor rectifier circuit 110 to the internal source voltage Vdd, even when the external source voltage Vcc becomes transiently greater than the internal source voltage Vdd at the early stage of the boosting step when the booster circuit boosts the internal source voltage Vdd using the external source voltage Vcc. This prevents the thyristor rectifier circuit 110 from malfunctioning and turning on.

The electro-static discharge protection circuit 100 as described above has the current control circuit 190. The current control circuit 190 has the first capacitive element C5. When the external source voltage Vcc, for example 2.5 V, is applied to the external source voltage supply line Vcc, the booster circuit in the internal circuitry boosts the internal source voltage Vdd of the internal source voltage supply line Vdd up to 23.5 V. At the early stage of the boosting step, when the booster circuit boosts the internal source voltage Vdd using the external source voltage Vcc, the external source voltage Vcc becomes transiently greater than the internal source voltage supply line Vdd. The first capacitive element C5 restricts a current from flowing from the second terminal G2 of the thyristor rectifier circuit 110 to the internal source voltage Vdd, even when the external source voltage Vcc becomes transiently greater than the internal source voltage Vdd at the early stage of the boosting step when the booster circuit boosts the internal source voltage Vdd using the external source voltage Vcc. This prevents the thyristor rectifier circuit 110 from malfunctioning and turning on.

On the other hand, when an electro-static discharge (ESD) is applied to the external source voltage supply line Vcc, the first capacitive element C5 allows the surge current induced by the electro-static discharge (ESD) to flow from the second terminal G2 of the thyristor rectifier circuit 110 to the internal source voltage supply line Vdd. This enables the internal circuitry to be protected from the surge current.

(3) Third Embodiment

Figure 7:
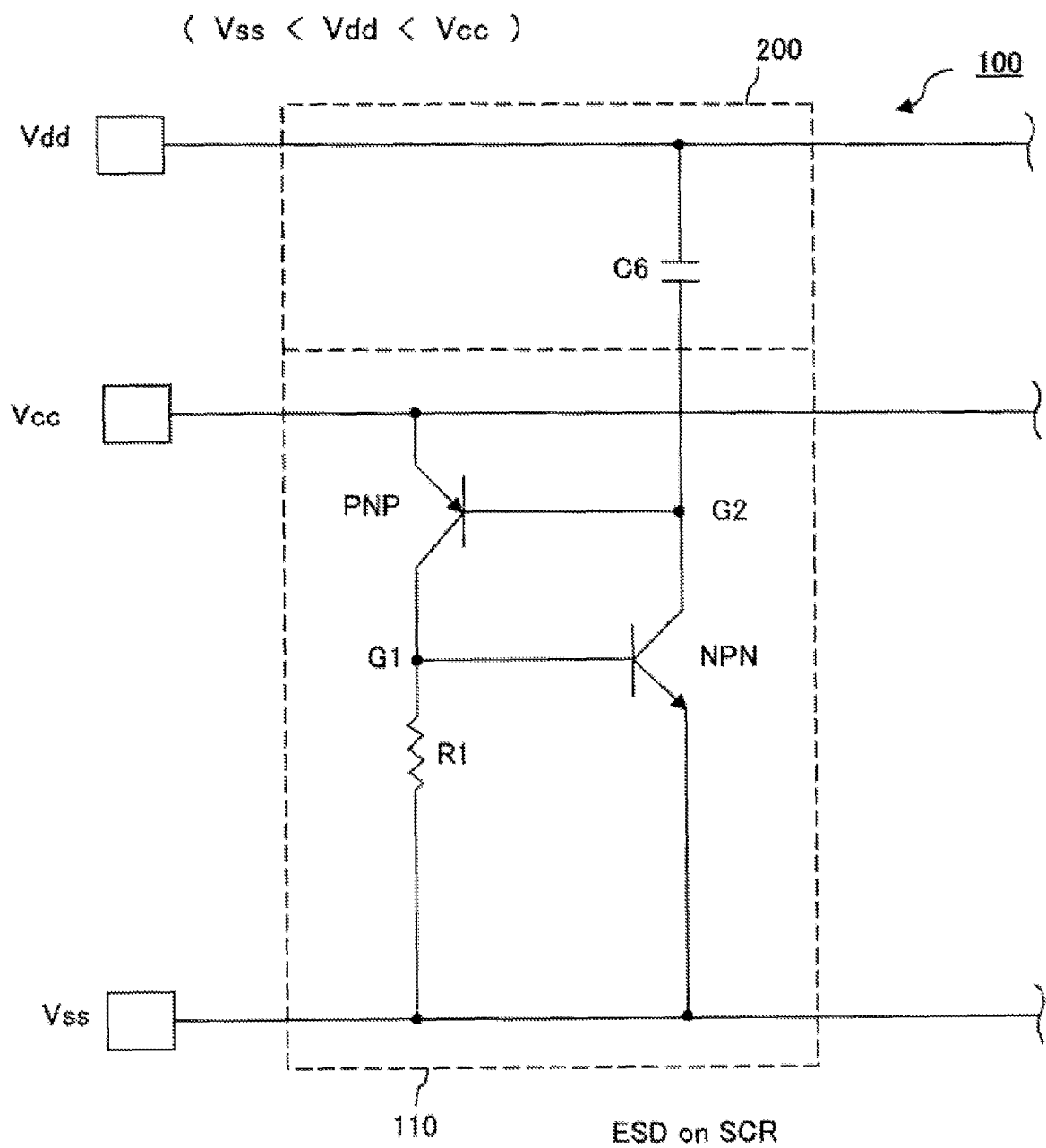
FIG. 7 is an equivalent circuit view of an electro-static discharge protection circuit according to a first embodiment of the present invention.

FIG. 7 shows an equivalent circuit view of the electro-static discharge protection circuit according to a second embodiment of the present invention. The electro-static discharge protection circuit 100 is electrically connected to an internal source voltage supply line Vdd that supplies an internal source voltage Vdd and an internal fixed voltage supply line Vss that supplies an internal fixed voltage Vss. Also, the electro-static discharge protection circuit 100 is electrically connected to internal circuitry to be protected from a surge current, and an external source voltage supply line Vcc that supplies an external source voltage Vcc.

The electro-static discharge protection circuit 100 has a thyristor rectifier circuit 110, and a current control circuit 200 which is electrically connected and mechanically coupled to the thyristor rectifier circuit 110. The thyristor rectifier circuit 110 is connected to the current control circuit 200 and the internal fixed voltage supply line Vss. The current control circuit 200 is electrically connected to the thyristor rectifier circuit 110 and the internal source voltage supply line Vdd. The thyristor rectifier circuit 110 and the current control circuit 200 are electrically connected to each other. The thyristor rectifier circuit 110 is further connected to the external source voltage supply line Vcc and internal circuitry (not shown). The internal circuitry has a booster circuit which boosts the internal source voltage Vdd of the internal source voltage supply line Vdd based on the external source voltage Vcc of the external source voltage supply line Vcc. When the external source voltage Vcc, for example 2.5 V, is applied to the external source voltage supply line Vcc, the booster circuit boosts the internal source voltage Vdd of the internal source voltage supply line Vdd up to 23.5 V. At the early stage of the boosting, the external source voltage Vcc can be transiently greater than the internal source voltage supply line Vdd. As used herein, the internal fixed voltage Vss supplied by the internal fixed voltage supply line Vss is lower at all times than the internal source voltage Vdd supplied by the internal source voltage supply line Vdd.

The thyristor rectifier circuit 110 has a vertical PNP bipolar transistor PNP1, a lateral NPN bipolar transistor NPN1, and a substrate resistance R1. The vertical PNP bipolar transistor PNP1 has an emitter that is connected to the external source voltage supply line Vcc. The vertical PNP bipolar transistor PNP1 has a collector that is connected to a first terminal G1, the internal fixed voltage supply line Vss through the first terminal G1, and the substrate resistance R1. The vertical PNP bipolar transistor PNP1 has a base that is connected to the current control circuit 200 through a second terminal G2. The lateral NPN bipolar transistor NPN1 has a collector that is connected to the base of the vertical PNP bipolar transistor PNP1 through the second terminal G2 and with the current control circuit 200 through the second terminal G2. The lateral NPN bipolar transistor NPN1 has an emitter which is connected to the internal fixed voltage supply line Vss. The lateral NPN bipolar transistor NPN1 has a base which is connected to the internal fixed voltage supply line Vss through the first terminal G1 and the substrate resistance R1, and with the collector of the vertical PNP bipolar transistor PNP1 through the first terminal G1.

The electro-static discharge protection circuit 100 is formed in a semiconductor substrate. The base of the lateral NPN bipolar transistor NPN1 and the collector of the vertical PNP bipolar transistor PNP1 are connected to the internal fixed voltage Vss through the substrate resistance R1. This means the semiconductor substrate forms the collector of the vertical PNP bipolar transistor PNP1 and the base of the lateral NPN bipolar transistor.

The current control circuit 200 has a second capacitive element C6 which is connected to the internal source voltage supply line Vdd and the second terminal G2 of the thyristor rectifier circuit 110. The second capacitive element C6 has a first electrode which is connected to the internal source voltage supply line Vdd and a second electrode which is connected to the second terminal G2 of the thyristor rectifier circuit 110. The second capacitive element C6 restricts a current from flowing from the second terminal G2 of the thyristor rectifier circuit 110 to the internal source voltage Vdd when the external source voltage Vcc becomes transiently greater than the internal source voltage Vdd at the early stage of the boosting step when the booster circuit boosts the internal source voltage Vdd using the external source voltage Vcc. This prevents the thyristor rectifier circuit 110 from malfunctioning and turning on.

Further, when an electro-static discharge (ESD) inputs into the external source voltage supply line Vcc, the second capacitive element C6 allows a surge current induced by electro-static discharge (ESD) applied to the external source voltage supply line Vcc to flow, from the second terminal G2 of the thyristor rectifier circuit 110 to the internal source voltage supply line Vdd to charge the second capacitive element C6.

When the surge current is applied to the external source voltage supply line Vcc, the surge current flows from the emitter to the base of the vertical PNP bipolar transistor PNP1. Further, the current flows from the base of the vertical PNP bipolar transistor PNP1 to the first capacitive element C6 through the second terminal G2 to charge the second capacitive element C6. Accordingly, the voltage of the base of vertical PNP bipolar transistor PNP1 rises.

The rise in potential at the base of the vertical PNP bipolar transistor PNP1 causes the potential difference between the base and the emitter of the vertical PNP bipolar transistor PNP1 to reach a threshold voltage Vbe so that the vertical PNP bipolar transistor PNP1 turns on. This allows the current applied to the external source voltage supply line Vcc to flow from the emitter to the collector of the vertical PNP bipolar transistor PNP1, and further from the collector to the internal fixed voltage supply line Vss through the substrate resistance R12. This means that the collector current of the vertical PNP bipolar transistor PNP1 flows into the semiconductor substrate in which the electro-static discharge protection circuit 100 is formed. The collector current flow to the semiconductor substrate causes the voltage drop across the substrate resistance R1 to be generated, and causes the potential of the semiconductor substrate to rise. Since the potential of the semiconductor substrate corresponds to the potential of the base of the lateral NPN bipolar transistor NPN1, the current flowing into the semiconductor substrate causes the potential of the semiconductor substrate and the potential of the base of the lateral NPN bipolar transistor NPN1 to rise.

On the other hand, the emitter potential of the lateral NPN bipolar transistor NPN1 is fixed to the lower voltage supplied by the internal fixed voltage supply line Vss. Thus, as the base potential of the vertical NPN bipolar transistor NPN rises, and the potential difference between the base and the emitter of the lateral NPN bipolar transistor NPN1 reaches a threshold voltage Vbe, the lateral NPN bipolar transistor NPN1 turns on. This turning on allows the current to flow from the collector to the emitter of the lateral NPN bipolar transistor NPN1. Accordingly, by means of the surge current applied to the external source voltage supply line Vcc, the thyristor rectifier circuit 110 is triggered into a thyristor mode.

Further, the current flow from the second terminal G2 of the thyristor rectifier circuit 110 to the internal source voltage Vdd is restricted, even when the external source voltage Vcc becomes transiently greater than the internal source voltage Vdd at the early stage of the boosting step when the booster circuit boosts the internal source voltage Vdd using the external source voltage Vcc. Accordingly, the second capacitive element C6 restricts a current from flowing from the second terminal G2 of the thyristor rectifier circuit 110 to the internal source voltage Vdd, even when the external source voltage Vcc becomes transiently greater than the internal source voltage Vdd at the early stage of the boosting step when the booster circuit boosts the internal source voltage Vdd using the external source voltage Vcc. This prevents the thyristor rectifier circuit 110 from malfunctioning and turning on.

Figure 8:
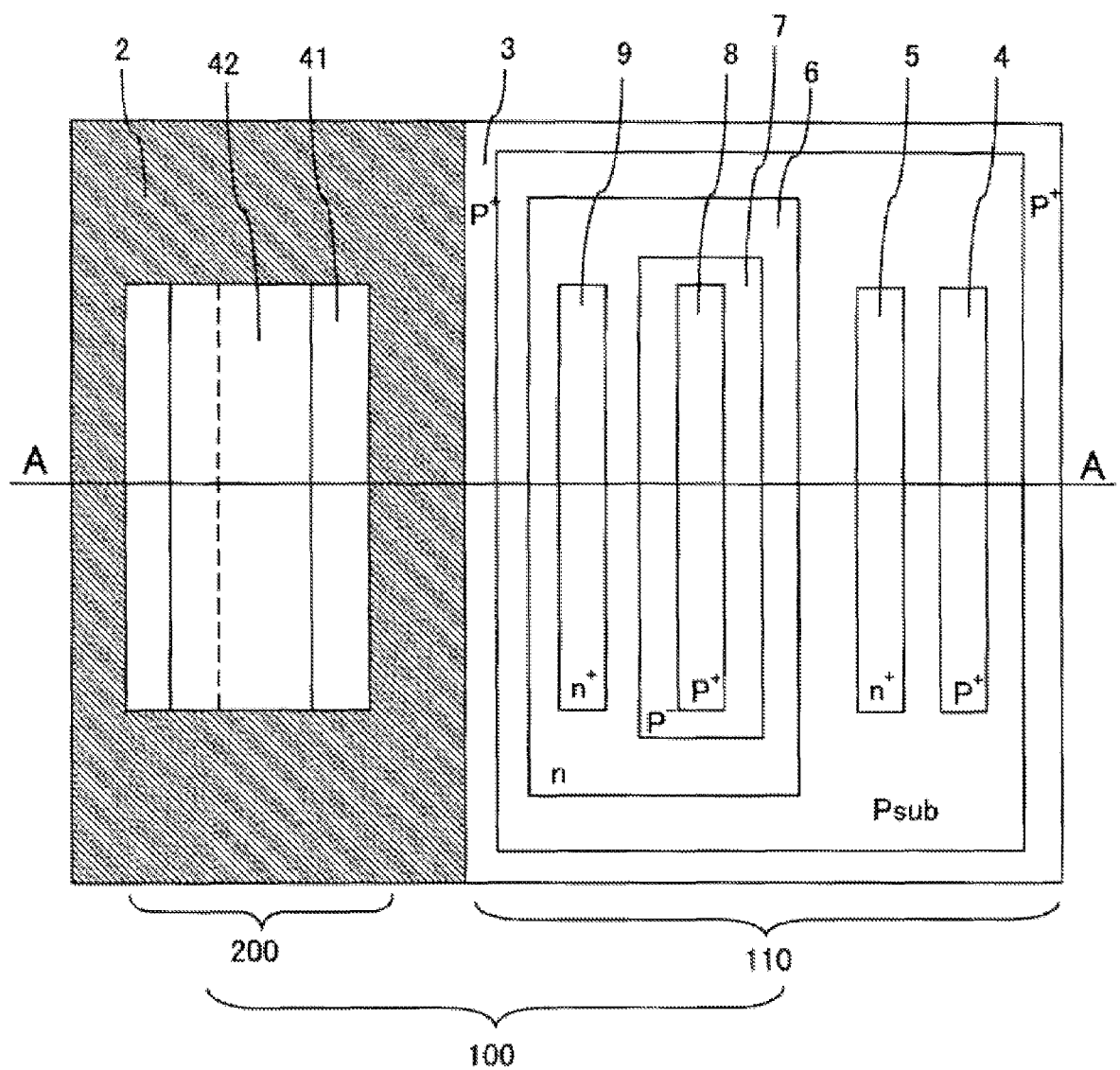
FIG. 8 is a schematic plan view of a schematic layout of the electro-static discharge protection circuit in FIG. 7 according to the first embodiment of the present invention which is formed in a semiconductor substrate.
Figure 9:
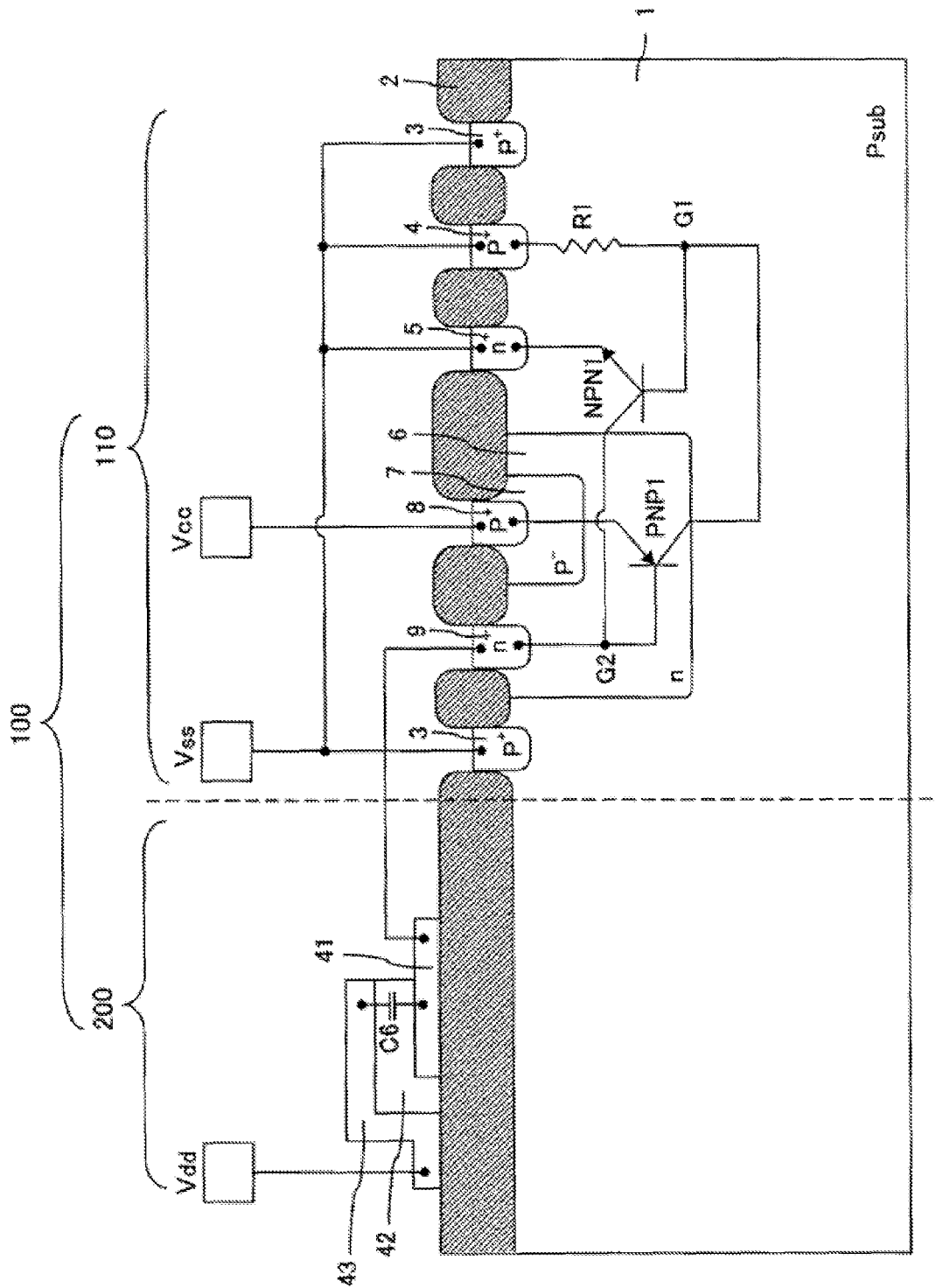
FIG. 9 is a schematic fragmentary longitudinal sectional view of the electro-static discharge protection circuit according to the first embodiment of the present invention taken along A-A line in FIG. 8.

As described above, the electro-static discharge protection circuit 100 is formed in the semiconductor substrate. The layout of the electro-static discharge protection circuit 100 will now be explained below. FIG. 8 shows a schematic plan view of a schematic layout of the electro-static discharge protection circuit 100 formed in the semiconductor substrate 1 which is explained with the equivalent circuit view in FIG. 7. FIG. 9 shows a schematic fragmentary longitudinal sectional view of the electro-static discharge protection circuit 100 taken along A-A line in FIG. 8.

The electro-static discharge protection circuit 100 has the thyristor rectifier circuit 110 and the current control circuit 200 as described with reference to FIG. 8. The current control circuit 200 is established between the internal source voltage supply line Vdd and the thyristor rectifier circuit 110. The electro-static discharge protection circuit 100, and the internal circuitry to be protected against the surge current by the electro-static discharge protection circuit 100, are formed in the P-type single-crystal semiconductor substrate 1. The electro-static discharge protection circuit 100 is established between the external source voltage supply line Vcc and the internal source voltage supply line Vdd. The electro-static discharge protection circuit 100 has the thyristor rectifier circuit 110 and the current control circuit 200 as described above. The current control circuit 200 is established between the internal source voltage supply line Vdd and the thyristor rectifier circuit 110. The thyristor rectifier circuit 110 is established between the external source voltage supply line Vcc and the internal circuitry.

As described in FIG. 8 and FIG. 9, the P-type single-crystal semiconductor substrate 1 has a surface which is provided with field oxide films 2 to define element separating regions. The field oxide films 2 define active regions in the P-type single-crystal semiconductor substrate 1. The thyristor rectifier circuit 110 is formed in active regions within a region surrounded by a $P^{30}$ guard ring 3 in the P-type single-crystal semiconductor substrate 1. The current control circuit 200 is formed on the field oxide films 2.

The region to establish the thyristor rectifier circuit 110 in the P-type single-crystal semiconductor substrate 1 contains a $P^-$ impurity diffusion region 4, a $N^+$ impurity diffusion region 5 separated by a field oxide film 2 from the $P^+$ impurity diffusion region 4, and an N-well region 6 separated by a field oxide film 2 from the $N^+$ impurity diffusion region 5. The N-well region 6 further contains an $N^+$ impurity diffusion region 9, and a P-type impurity diffusion region 7 separated from the $N^+$ impurity diffusion region 9. The P-type impurity diffusion region 7 further contains a $P^+$ impurity diffusion region 8.

The P-type impurity diffusion region 7 corresponds to the emitter of the vertical PNP bipolar transistor PNP1, the emitter being connected to the external source voltage supply line Vcc through the $P^+$ impurity diffusion region 8. The N-well region 6 corresponds to the base of the vertical PNP bipolar transistor PNP1, the base being connected to the current control circuit 200 composed of the second capacitive element C6. The P-type single-crystal semiconductor substrate 1 also corresponds to the base of the lateral NPN bipolar transistor NPN1, the base being connected to the internal fixed voltage supply line Vss through the $P^+$ impurity diffusion region 4. The P-type single-crystal semiconductor substrate 1 also corresponds to the base of the lateral NPN bipolar transistor NPN1, the base being connected to the internal fixed voltage supply line Vss through the $P^+$ impurity diffusion region 4. The N-well region 6 corresponds to the collector of the lateral NPN bipolar transistor NPN1, the collector being connected to the current control circuit 200 composed of the second capacitive element C6 through the $N^+$ impurity diffusion region 9. The $N^-$ impurity diffusion region 5 corresponds to the emitter of the lateral NPN bipolar transistor NPN1, the emitter being connected to the internal fixed voltage supply line Vss. Resistance to the current flow in the P-type single-crystal semiconductor substrate 1 corresponds to the substrate resistance R1.

The region in the P-type single-crystal semiconductor substrate 1 to establish the current control circuit 200 is provided with a first poly silicon electrode 41, a first dielectric film 42 lying on the upper surface and the side surface of the first poly silicon electrode 41, and the second poly silicon electrode 43 lying on the first dielectric film 42 and the field oxide film 2. The first poly silicon electrode 41, the first dielectric film 42, and the second poly silicon electrode 43 form the second capacitive element C6. In other words the second capacitive element C6 consists of a MOS capacitor. The second poly silicon electrode 43 corresponds to the first electrode of the second capacitive element C6. The first electrode is connected to the internal source voltage Vdd. The first poly silicon electrode 41 corresponds to the second electrode of the second capacitive element C6. The second electrode is connected to the N-well region 6 which forms the base of the vertical PNP bipolar transistor PNP1 and the collector of the lateral NPN bipolar transistor NPN1, through the $N^+$ impurity diffusion region 9.

When a surge current is applied to the external source voltage supply line Vcc, a forward current flows from the P-type impurity diffusion region 7 which forms the emitter of the vertical PNP bipolar transistor PNP1 to the N-well region 6 which forms the base of the vertical PNP bipolar transistor PNP1 through the PN junction. Further, the current flows from the N-well region 6 which forms the base of the vertical PNP bipolar transistor PNP1, to first poly silicon electrode 41 which forms the second electrode of the second capacitive element C6, through the $N^{30}$ impurity diffusion region 9 which forms the second terminal G2, to charge the second capacitive element C6. Thus the second capacitive element C6 provides a sufficient constant voltage at all times. This allows the second element C6 to provide a constant and sufficient capacitance. The second capacitive element C6, other than the stray capacitances, consistently ensures the flow of a surge current applied to the external source voltage supply line Vcc to flow to the second capacitive element C6, through the emitter and the base of the vertical PNP bipolar transistor PNP1. As a result, the potential of the N-well region 6 which forms the base of vertical PNP bipolar transistor PNP1 rises.

As the potential of the N-well region 6 which forms the base of vertical PNP bipolar transistor PNP1 rises, and the potential difference between the emitter and the base of the vertical PNP bipolar transistor PNP1, namely, the difference between the potential of the N-well region 6 and the potential of the $P^-$ impurity diffusion region 7, reaches a threshold voltage Vbe, the vertical PNP bipolar transistor PNP1 turns on. This turning on causes the surge current applied to the external source voltage supply line Vcc to flow, from the P-type impurity diffusion region 7 which forms the emitter of the vertical PNP bipolar transistor PNP1, to the P-type single-crystal semiconductor substrate 1 which forms the collector of the vertical PNP bipolar transistor PNP1, through the N-well region 6, further to the internal fixed voltage supply line Vss through the substrate resistance R1 and the $P^+$ impurity diffusion region 4. In other words, the collector current of the vertical PNP bipolar transistor PNP1 flows into the P-type single-crystal semiconductor substrate 1 in which the electrostatic discharge protection circuit 100 is formed. This flow causes the voltage across the resistance R1 to generate, and the potential of the P-type single-crystal semiconductor substrate 1 to rise. Since the potential of the semiconductor substrate corresponds to the potential of the base of the lateral NPN bipolar transistor NPN1, the current flow to the P-type single-crystal semiconductor substrate 1 causes the potential of the P-type single-crystal semiconductor substrate 1 and the potential of the base of the lateral NPN bipolar transistor NPN1 to rise.

Meanwhile, as the potential of the P-type single-crystal semiconductor substrate 1 which forms the base of the lateral NPN bipolar transistor NPN1 rises, and the potential difference between the base and the emitter of the lateral NPN bipolar transistor NPN1, namely the difference between the potential of the P-type single-crystal semiconductor substrate 1 and the potential of the $N^-$ impurity diffusion region 5, reaches a threshold voltage Vbe, the lateral NPN bipolar transistor NPN1 turns on. This turning on causes the current to flow from the N-well region 6 which forms the collector of the lateral NPN bipolar transistor NPN1, to the $N^+$ impurity diffusion region 5 which forms the emitter of the lateral NPN bipolar transistor NPN1, through the P-type single-crystal semiconductor substrate 1 which forms the base of the lateral NPN bipolar transistor NPN1. As a result, by means of the surge current, the thyristor rectifier circuit 110 is triggered into a thyristor mode.

As described above, the current control circuit 200 including the second capacitive element C6 which is connected to the internal source voltage supply line Vdd and the second terminal G2 of the thyristor rectifier circuit 110, prevents a current from flowing from the first poly silicon electrode 41 to the second poly silicon electrode 43 through the first dielectric film 42, while a current flows into the first poly silicon electrode 41 which forms the second electrode of the second capacitive element C6, from the N-well region 6 which forms the base of the vertical PNP bipolar transistor PNP1 of the thyristor rectifier circuit 110, through the $N^+$ impurity diffusion region 9, when the external source voltage Vcc becomes transiently greater than the internal source voltage supply line Vdd at the early stage of the boosting step when the booster circuit boosts the internal source voltage Vdd using the external source voltage Vcc by the booster circuit. Accordingly, the current control circuit 200 including the first second element C6 which is connected to the internal source voltage supply line Vdd and the second terminal G2 of the thyristor rectifier circuit 110, restricts a current from flowing from the second terminal G2 of the thyristor rectifier circuit 110 to the internal source voltage Vdd, even when the external source voltage Vcc becomes transiently greater than the internal source voltage Vdd at the early stage of the boosting step when the booster circuit boosts the internal source voltage Vdd using the external source voltage Vcc. This prevents the thyristor rectifier circuit 110 from malfunctioning and turning on.

The electro-static discharge protection circuit 100 as described above has the current control circuit 200. The current control circuit 200 has the second capacitive element C6. When the external source voltage Vcc, for example 2.5 V, is applied to the external source voltage supply line Vcc, the booster circuit in the internal circuitry boosts the internal source voltage Vdd of the internal source voltage supply line Vdd up to 23.5 V. At the early stage of the boosting step when the booster circuit boosts the internal source voltage Vdd using the external source voltage Vcc, the external source voltage Vcc becomes transiently greater than the internal source voltage supply line Vdd. The second capacitive element C6 restricts a current from flowing from the second terminal G2 of the thyristor rectifier circuit 110 to the internal source voltage supply line Vdd, even when the external source voltage Vcc becomes transiently greater than the internal source voltage Vdd at the early stage of the boosting step when the booster circuit boosts the internal source voltage Vdd using the external source voltage Vcc. This prevents the thyristor rectifier circuit 110 from malfunctioning and turning on.

On the other hand when an electro-static discharge (ESD) is applied to the external source voltage supply line Vcc, the second capacitive element C6 allows the surge current induced by the electro-static discharge (ESD) to flow from the second terminal G2 of the thyristor rectifier circuit 110 to the internal source voltage supply line Vdd. This enables the internal circuitry to be protected from the surge current.

Terms of degree such as "substantially" and "nearly" used herein mean a reasonable amount of deviation of the modified term such that the end result is not significantly changed. For example, these terms can be construed as including a deviation of at least ±5% of the modified term if this deviation would not negate the meaning of the word it modifies.

While only selected embodiments have been chosen to illustrate the present invention, it will be apparent to those skilled in the art from this disclosure that various changes and modifications can be made herein without departing from the scope of the invention as defined in the appended claims.

Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. An electrostatic protection circuit, comprising:
   a first thyristor rectifier circuit electrically coupled to an internal circuitry, an external source voltage supply line that supplies an external source voltage to the internal circuitry, and an internal fixed voltage supply line that supplies an internal fixed voltage to the internal circuitry;
   a first current control circuit electrically coupled to the first thyristor rectifier circuit and an internal source voltage supply line that supplies an internal source voltage to the first internal circuitry, the first current control circuit restricting a current from flowing from the external source voltage supply line to the internal source voltage supply line through the first thyristor rectifier circuit when the external source voltage supply line becomes greater than the internal source voltage supply line, the first current control circuit making a surge current flow to the internal fixed voltage supply line through the first thyristor rectifier circuit by triggering the first thyristor rectifier circuit into a thyristor mode by means of the surge current applied to the external source voltage supply line in order to protect the first internal circuitry from the surge current.

2. The electrostatic protection circuit according to claim 1, wherein the first current control circuit includes a first capacitive element electrically coupled to the internal source voltage supply line and the first thyristor rectifier circuit.

3. The electrostatic protection circuit according to claim 2, wherein a semiconductor substrate having a first conductive type has the first thyristor rectifier circuit and the first current control circuit formed therein, and
   the first capacitive element has a first impurity diffusion region having a second conductive type formed in the semiconductor substrate, a first dielectric film lying on the first impurity diffusion portion, and a first conductive firm lying on the first dielectric film.

4. The electrostatic protection circuit according to claim 2, wherein a semiconductor substrate having a first conductive type has the first thyristor rectifier circuit and the first current control circuit formed therein, the semiconductor substrate having a first element separating insulation film, and the first capacitive element has a first conductive film lying on the first element separating insulation film, a first dielectric film lying on the first conductive film, and a second conductive film lying the first dielectric film.

5. The electrostatic protection circuit according to claim 1, wherein the first current control circuit has one or more diodes electrically coupled to the internal source voltage supply line and the first thyristor rectifier circuit.

6. The electrostatic protection circuit according to claim 5, wherein a semiconductor substrate having a first conductive type has the first thyristor rectifier circuit and the first current control circuit formed therein, the diodes are comprised of a PN-junction, the PN-junction being formed from the semiconductor substrate and a second well region having a second conductive type formed in the semiconductor substrate.

7. The electrostatic protection circuit according to claim 5, wherein the diodes have a forward breakdown voltage greater in total than the voltage difference between the external source voltage supply line and the internal source voltage supply line when the external source voltage supply line becomes greater than the internal source voltage supply line.

8. The electrostatic protection circuit according to claim 1, wherein the first thyristor rectifier circuit comprises:

a first bipolar transistor having a first emitter electrically coupled to the external source voltage supply line, a first collector electrically coupled to the internal fixed voltage supply line, and a first base electrically coupled to the first current control circuit;

a second bipolar transistor having a second emitter electrically coupled to the internal fixed voltage supply line, a second collector electrically coupled to the first base and the first current control circuit, and a second base electrically coupled to the first collector and the internal fixed voltage supply line.

9. A semiconductor device, comprising:

a first internal circuitry;

an external source voltage supply line which supplies an external source voltage to the internal circuitry;

an internal source voltage supply line which supplies an internal source voltage to the internal circuitry;

an internal fixed voltage supply line which supplies an internal fixed voltage to the internal circuitry;

at least one electrostatic protection circuit, each electrostatic protection circuit further comprising:

a first thyristor rectifier circuit electrically coupled to the first internal circuitry, the external source voltage supply line, and the internal fixed voltage supply line;

a first current control circuit electrically coupled to the internal source voltage supply line and the first thyristor rectifier circuit, the first current control circuit restricting a current from flowing from the external source voltage supply line to the internal source voltage supply line through the first thyristor rectifier circuit when the external source voltage supply line becomes greater than the internal source voltage supply line, the first current control circuit making a surge current flow to the internal fixed voltage supply line through the first thyristor rectifier circuit by triggering the first thyristor rectifier circuit into a thyristor mode by means of the surge current applied to the external source voltage supply line in order to protect the first internal circuitry from the surge current.

10. The semiconductor device according to claim 9, wherein the first current control circuit includes a first capacitive element electrically coupled to the internal source voltage supply line and the first thyristor rectifier circuit.

11. The semiconductor device according to claim 10, wherein a semiconductor substrate having a first conductive type has the first thyristor rectifier circuit and the first current control circuit formed therein, and the first capacitive element has a first impurity diffusion region having a second conductive type formed in the semiconductor substrate, a first dielectric film lying on the first impurity diffusion portion, and a first conductive film lying on the first dielectric film.

12. The semiconductor device according to claim 10, wherein a semiconductor substrate having a first conductive type has the first thyristor rectifier circuit and the first current control circuit formed therein, the semiconductor substrate having a first element separating insulation film, and the first capacitive element has a first conductive film lying on the first element separating insulation film, a first dielectric film lying on the first conductive film, and a second conductive film lying on the first dielectric film.

13. The semiconductor device according to claim 9, wherein the first current control circuit has one or more diodes electrically coupled to the internal source voltage supply line and the first thyristor rectifier circuit.

14. The semiconductor device according to claim 13, wherein a semiconductor substrate having a first conductive type has the first thyristor rectifier circuit and the first current control circuit formed therein, the diodes are comprised of a PN-junction, the PN-junction being formed from the semiconductor substrate and a second well region having a second conductive type formed in the semiconductor substrate.

15. The electrostatic protection circuit according to claim 13, wherein the diodes have a forward breakdown voltage greater in total than the voltage difference between the external source voltage supply line and the internal source voltage supply line when the external source voltage supply line becomes greater than the internal source voltage supply line.

16. The electrostatic protection circuit according to claim 9, wherein the first thyristor rectifier circuit comprises:

a first bipolar transistor having a first emitter electrically coupled to the external source voltage supply line, a first collector electrically coupled to the internal fixed voltage supply line, and a first base electrically coupled to the first current control circuit;

a second bipolar transistor having a second emitter electrically coupled to the internal fixed voltage supply line, a second collector electrically coupled to the first base and the first current control circuit, and a second base electrically coupled to the first collector and the internal fixed voltage supply line.

* * * * *